United States Patent [19]
Urquhart, II

[11] Patent Number: 5,397,861
[45] Date of Patent: Mar. 14, 1995

[54] ELECTRICAL INTERCONNECTION BOARD

[75] Inventor: David H. Urquhart, II, Lakeville, Mass.

[73] Assignee: Mupac Corporation, Brockton, Mass.

[21] Appl. No.: 964,346

[22] Filed: Oct. 21, 1992

[51] Int. Cl.$^6$ .............................................. H05K 1/00
[52] U.S. Cl. ..................................... 174/250; 174/262; 174/266; 361/784; 361/792; 361/794
[58] Field of Search ....................... 174/250, 262, 266; 361/784, 790, 791, 792, 794

[56] References Cited

U.S. PATENT DOCUMENTS

| | | |
|---|---|---|
| 2,754,484 | 7/1956 | Adams . |
| 3,093,805 | 6/1963 | Osifchin et al. . |
| 3,135,935 | 6/1964 | Engelbrecht . |
| 3,459,879 | 8/1969 | Gerpheide . |
| 3,740,678 | 6/1973 | Hill . |
| 3,757,028 | 9/1973 | Schlessel . |
| 4,045,750 | 8/1977 | Marshall . |
| 4,054,939 | 10/1977 | Ammon . |
| 4,130,723 | 12/1978 | Wakeling . |
| 4,157,612 | 6/1979 | Rainal . |
| 4,320,438 | 3/1982 | Ibrahim et al. . |
| 4,362,899 | 12/1982 | Borrill . |
| 4,417,392 | 11/1983 | Ibrahim et al. . |
| 4,494,172 | 1/1985 | Leary et al. . |
| 4,739,453 | 4/1988 | Kurokawa . |
| 4,954,929 | 9/1990 | Baran . |
| 4,969,089 | 11/1990 | Jäkel . |
| 5,043,848 | 8/1991 | Rogers et al. . |
| 5,159,536 | 10/1992 | Silverio . |
| 5,191,174 | 3/1993 | Chang et al. . |
| 5,200,579 | 4/1993 | Takeuchi . |
| 5,239,448 | 8/1993 | Perkins . |

FOREIGN PATENT DOCUMENTS

| | | |
|---|---|---|
| 0259785A2 | 3/1988 | European Pat. Off. . |
| 0298220A2 | 1/1989 | European Pat. Off. . |
| 0387749A2 | 9/1990 | European Pat. Off. . |
| 0393302A1 | 10/1990 | European Pat. Off. . |
| 0467521A2 | 1/1992 | European Pat. Off. . |

OTHER PUBLICATIONS

IBM Technical Disclosure Bulletin, A. V. Brown, "Fabricating Miniature Strip Lines", vol. 12, No. 10, pp. 1637-1638, Mar. 1970.

Primary Examiner—Leo P. Picard
Assistant Examiner—Cheryl R. Figlin
Attorney, Agent, or Firm—Fish & Richardson

[57] ABSTRACT

An electrical interconnection board (e.g., a backplane) in which connection positions are spaced along one dimension of the board. Each connection position includes holes for making electrical connections. Layers of the board each have a pattern of conductive path segments connecting holes at each connection position with corresponding holes at other connection positions. The path segments together define continuous conductive routes along the length of the board. Each conductive route includes path segments which respectively lie on different layers. This arrangement increases the distance along which any two pairs of the conductive routes are adjacent each other on a layer, thus reducing interference (e.g., mutual coupling and crosstalk) and improving signal transmission characteristics.

12 Claims, 27 Drawing Sheets

LINE 202

|  |  |  |  |  |  |
|---|---|---|---|---|---|
| 29C | 90 | 28B | 27C | 26B | 25C | LAYER X
| 29A |  | 28C | 27A | 26C | 25A | LAYER Y
| 29B |  | 28A | 27B | 26A | 25B | LAYER Z

FIG. 29

LINE 204

| 29A | 90 | 28B | 27A | 26B | 25A | LAYER X
| 29C |  | 28A | 27C | 26A | 25C | LAYER Y
| 29B |  | 28C | 27B | 26C | 25B | LAYER Z

FIG. 30

LINE 206

| 29A | 90 | 28A | 27A | 26A | 25A | LAYER X
| 29B |  | 28B | 27B | 26B | 25B | LAYER Y
| 29C |  | 28C | 27C | 26C | 25C | LAYER Z

FIG. 31

ELECTRICAL INTERCONNECTION BOARD

BACKGROUND OF THE INVENTION

This invention relates to electrical interconnection boards.

One kind of electrical interconnection board is a backplane used, e.g., in a computer for distributing electrical power and signals to printed circuit (daughter) boards.

Typically a series of circuit board connectors are spaced regularly along the length of the backplane. Multiple circuit layers of the backplane route the signals and power to the connectors. Plated through holes electrically interconnect runs of different circuit layers as needed.

The connectors are often all "wired" in the same way so that a given daughter board can be mounted in any one of the connectors along the length of the backplane. Such multilayer backplanes generally provide better EMI/RF shielding for applications using high speed semiconductor devices than single layer backplanes.

SUMMARY OF THE INVENTION

In general, the invention features an electrical interconnection board (e.g., a backplane) in which connection positions are spaced along one dimension of the board. Each connection position includes holes for making electrical connections. Layers of the board each have a pattern of conductive path segments connecting holes at each connection position with corresponding holes at other connection positions. The path segments together define continuous conductive routes along the length of the board. Each conductive route includes path segments which respectively lie on different layers. This arrangement decreases the distance along which any two pairs of the conductive routes are adjacent each other on a layer, thus reducing interference (e.g., mutual coupling and crosstalk) and improving signal transmission characteristics.

Preferred embodiments of the invention include the following features. The conductive path segments are parallel to each other, and some of the path segments of one of the layers do not lie directly below path segments of another of the layers. The board includes ground planes; conductive guard traces on the layers are connected to the ground planes and are not connected to any of the holes at the connection positions. In the case of offset path segments, the path segments of one layer lie midway between lines which are below path segments of the other layer.

There are N (e.g., 3) layers and the pattern of the conductive path segments repeats every N connection positions along the board.

In some embodiments, all of the path segments of each conductive route lie on only two of the layers. The connectors may be standard 96-pin DIN connectors spaced regularly along the length of the backplane.

Other advantages and features will become apparent from the following description and from the claims.

DESCRIPTION

We first briefly describe the drawings.

FIGS. 29 through 31 are schematic cross sectional views at three view points along the length of the other backplane.

Figure 1:
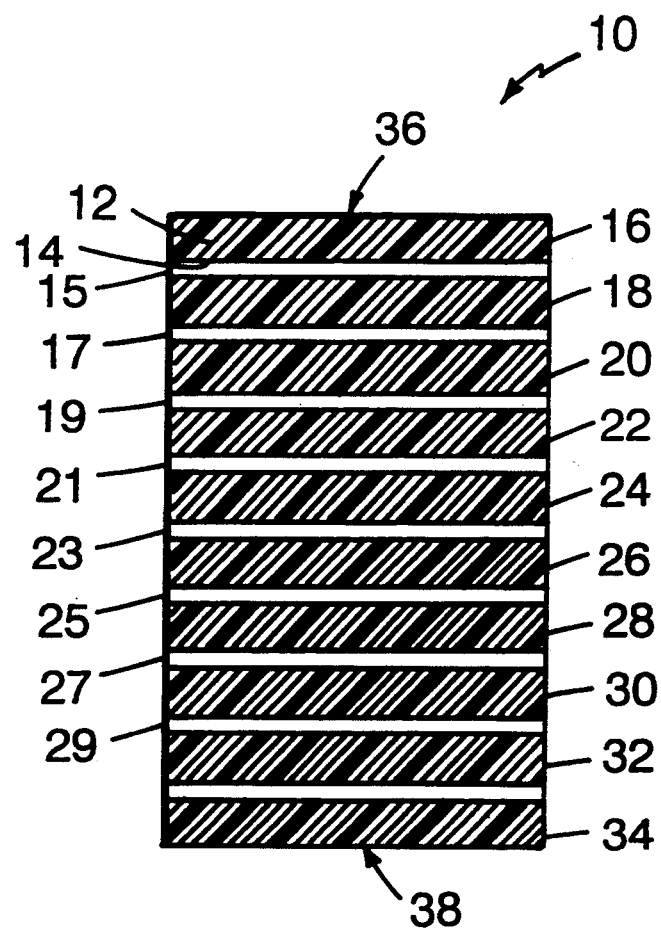
FIG. 1 is a schematic side sectional view of the layers of a backplane, not to scale.
Figure 2:
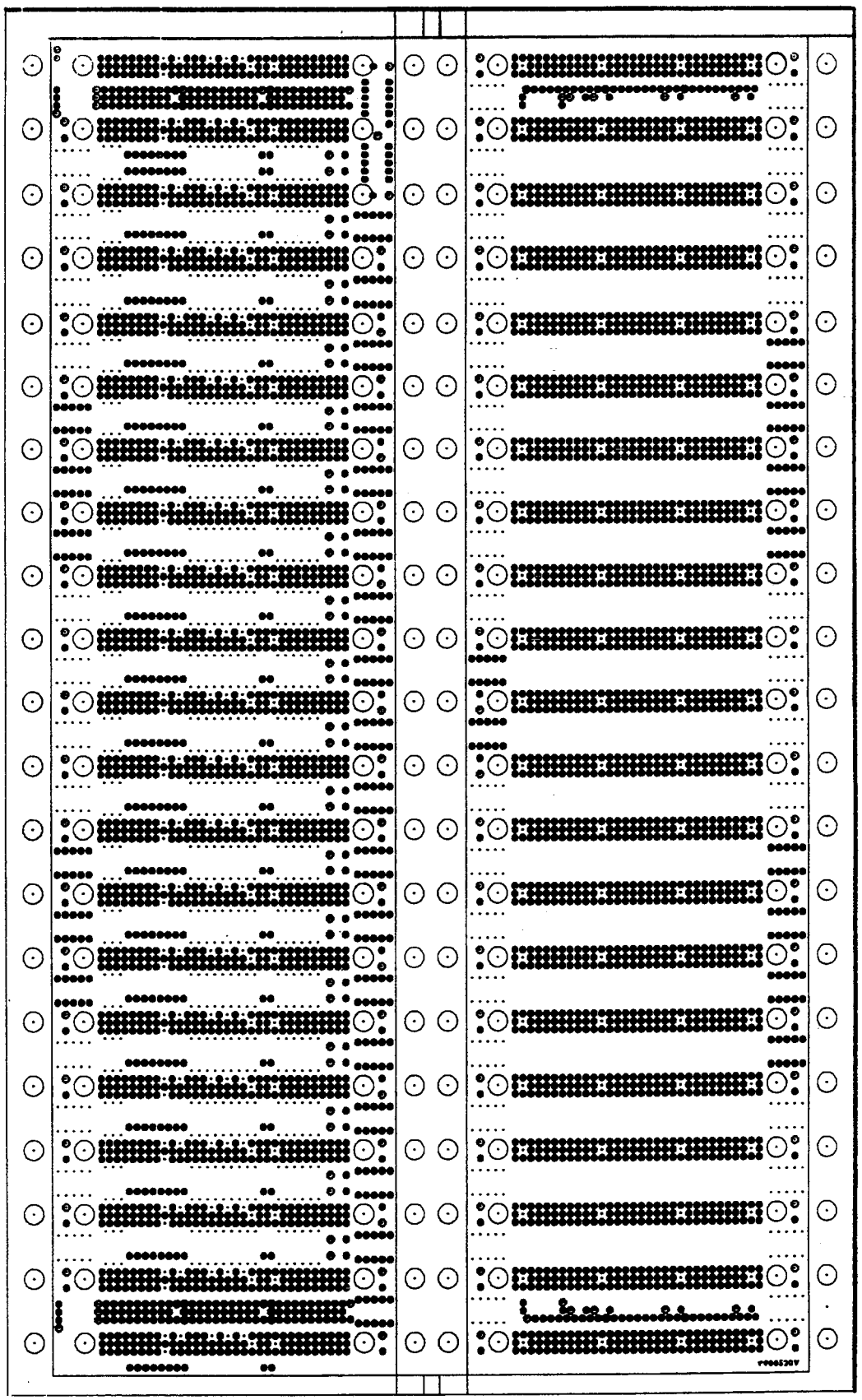
FIGS. 2 through 10 are plan views of fabrication artwork showing the configuration of the conductive layers of the backplane.
Figure 3:
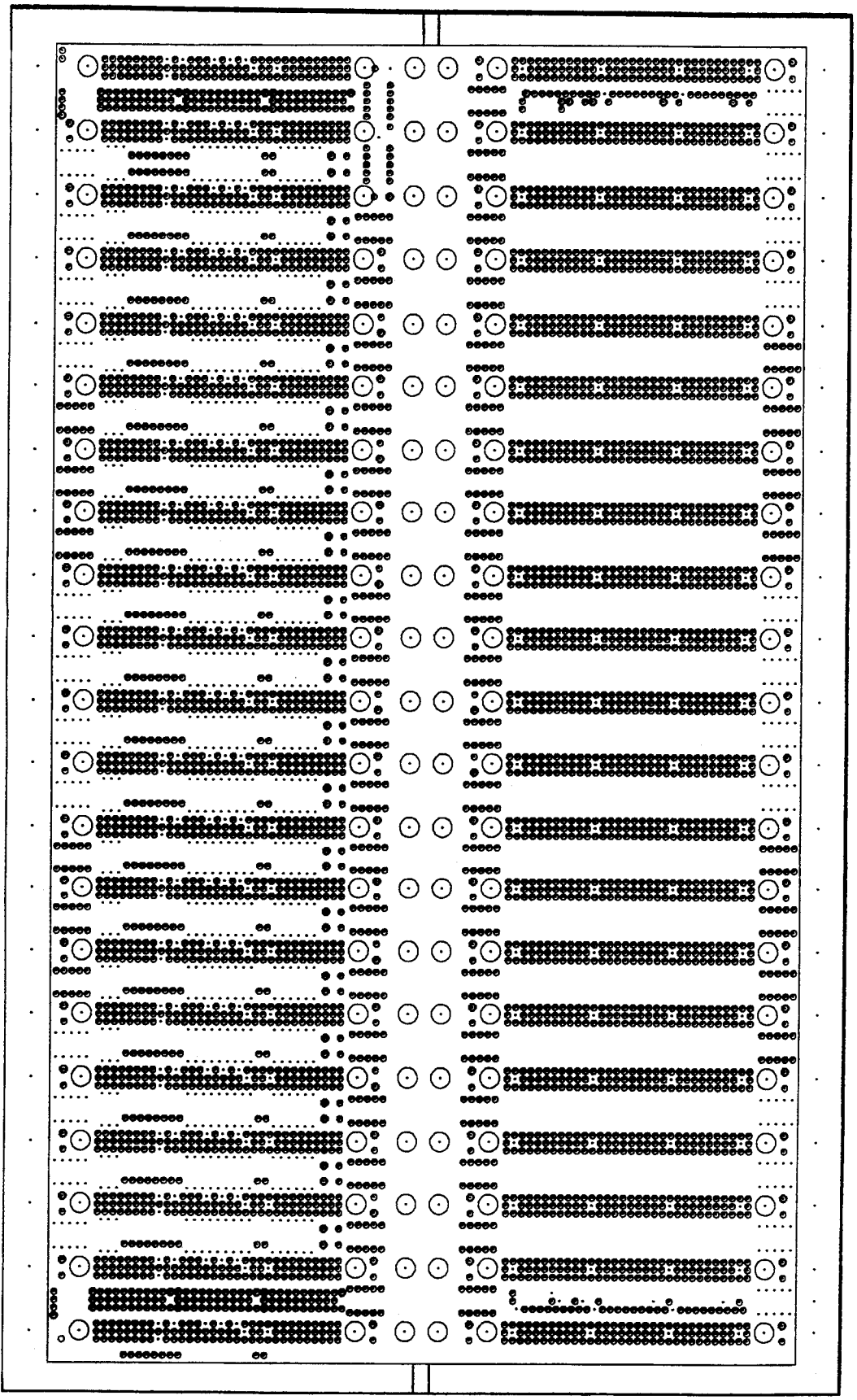
Figure 4:
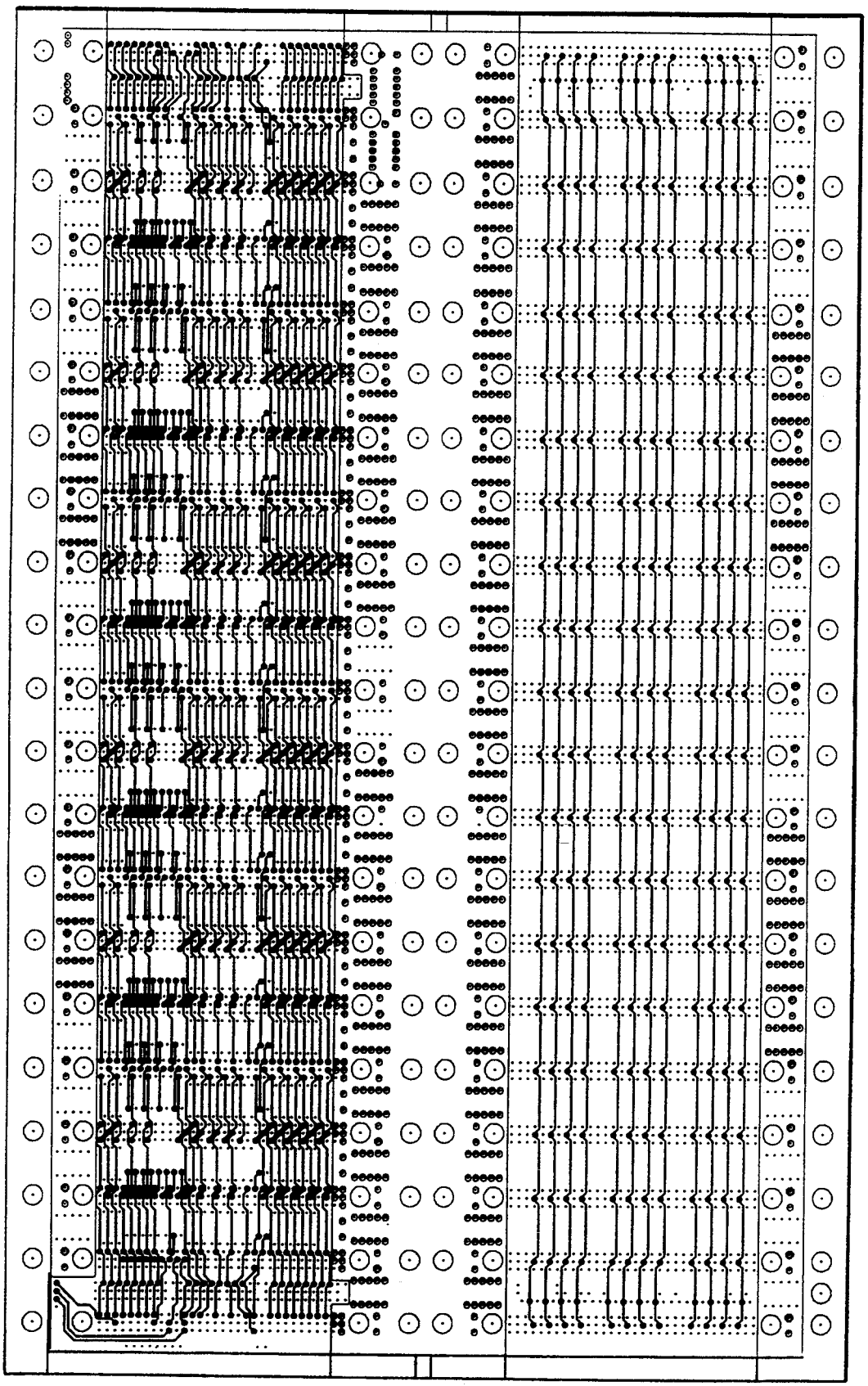
Figure 5:
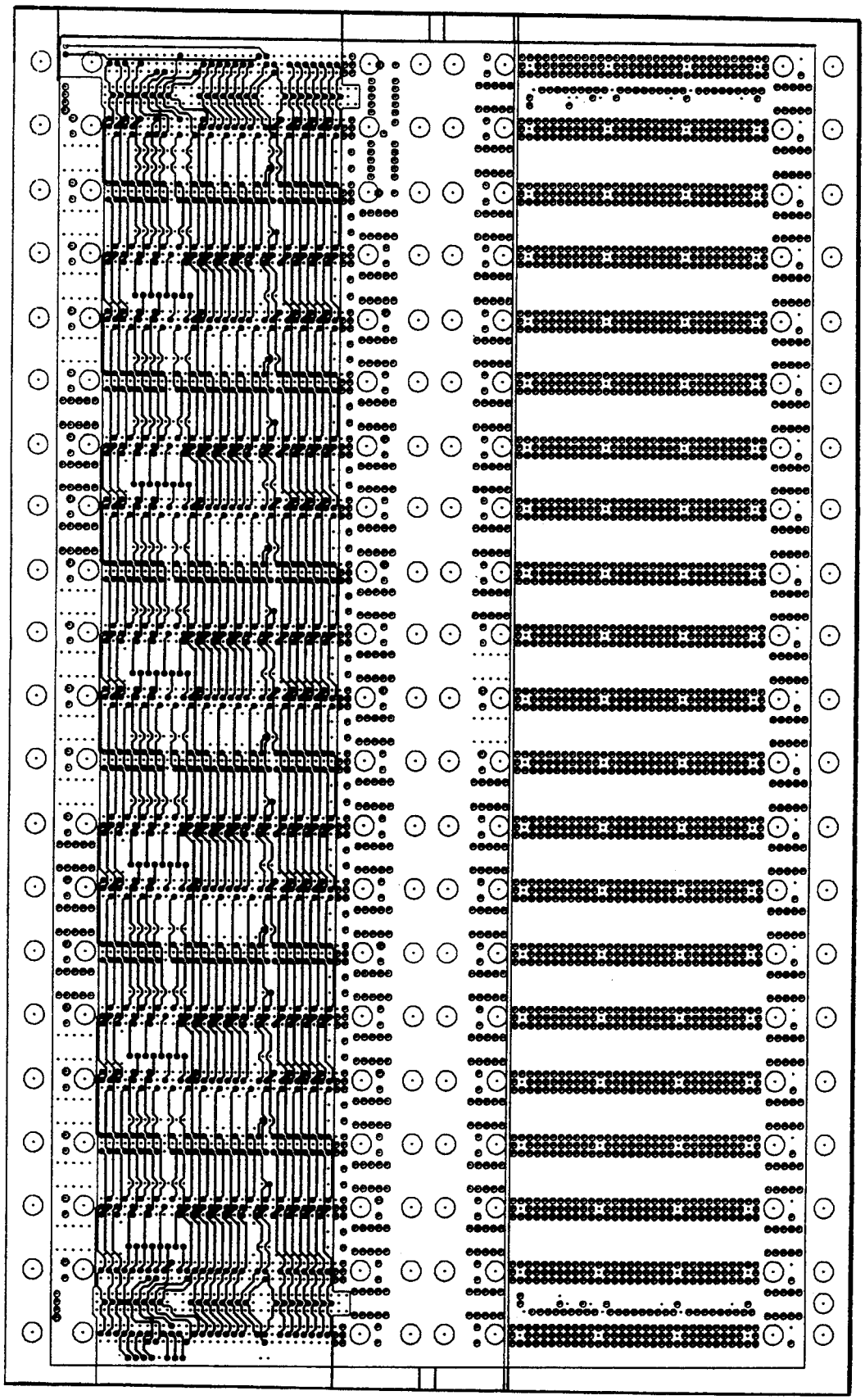
Figure 6:
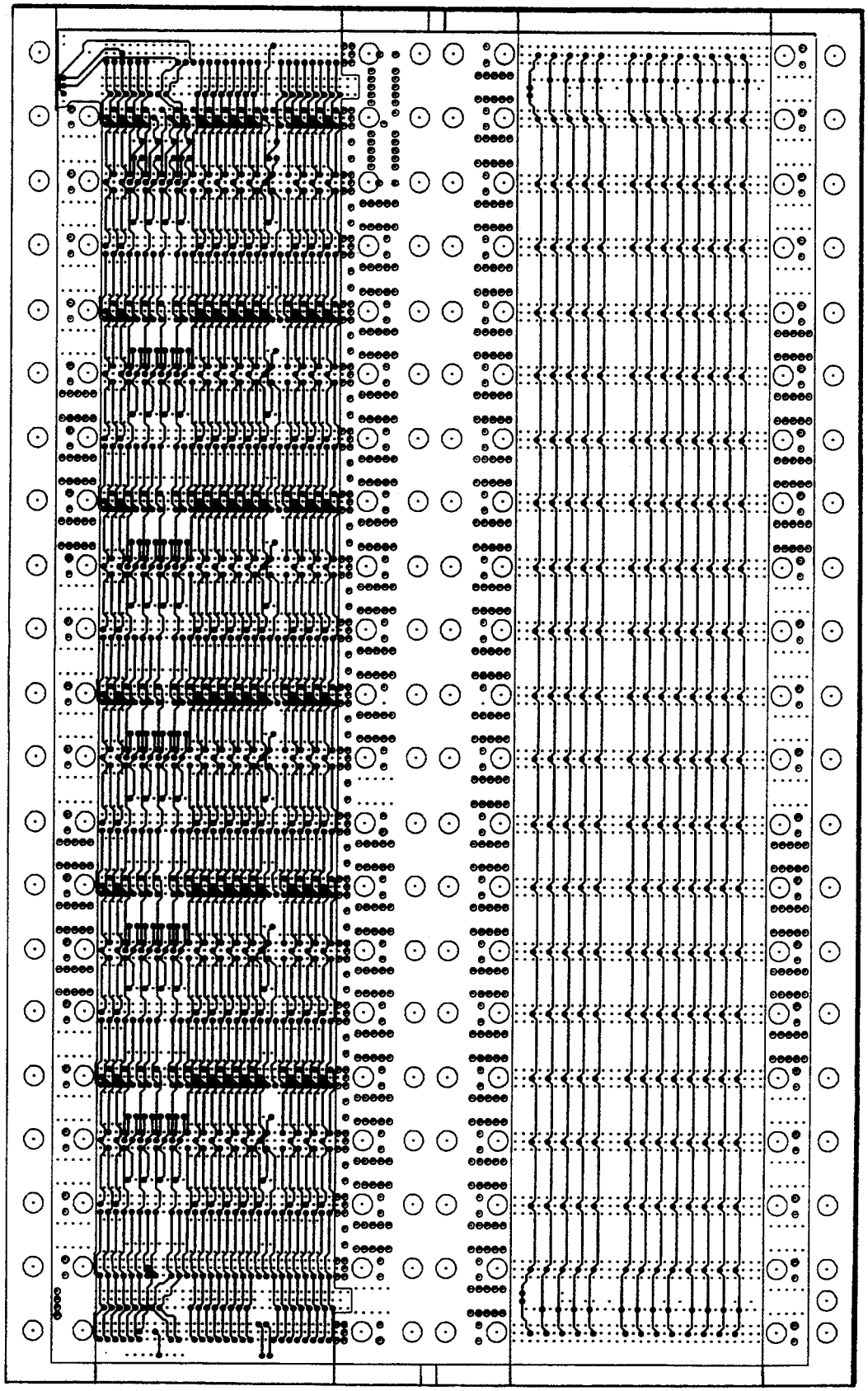
Figure 7:
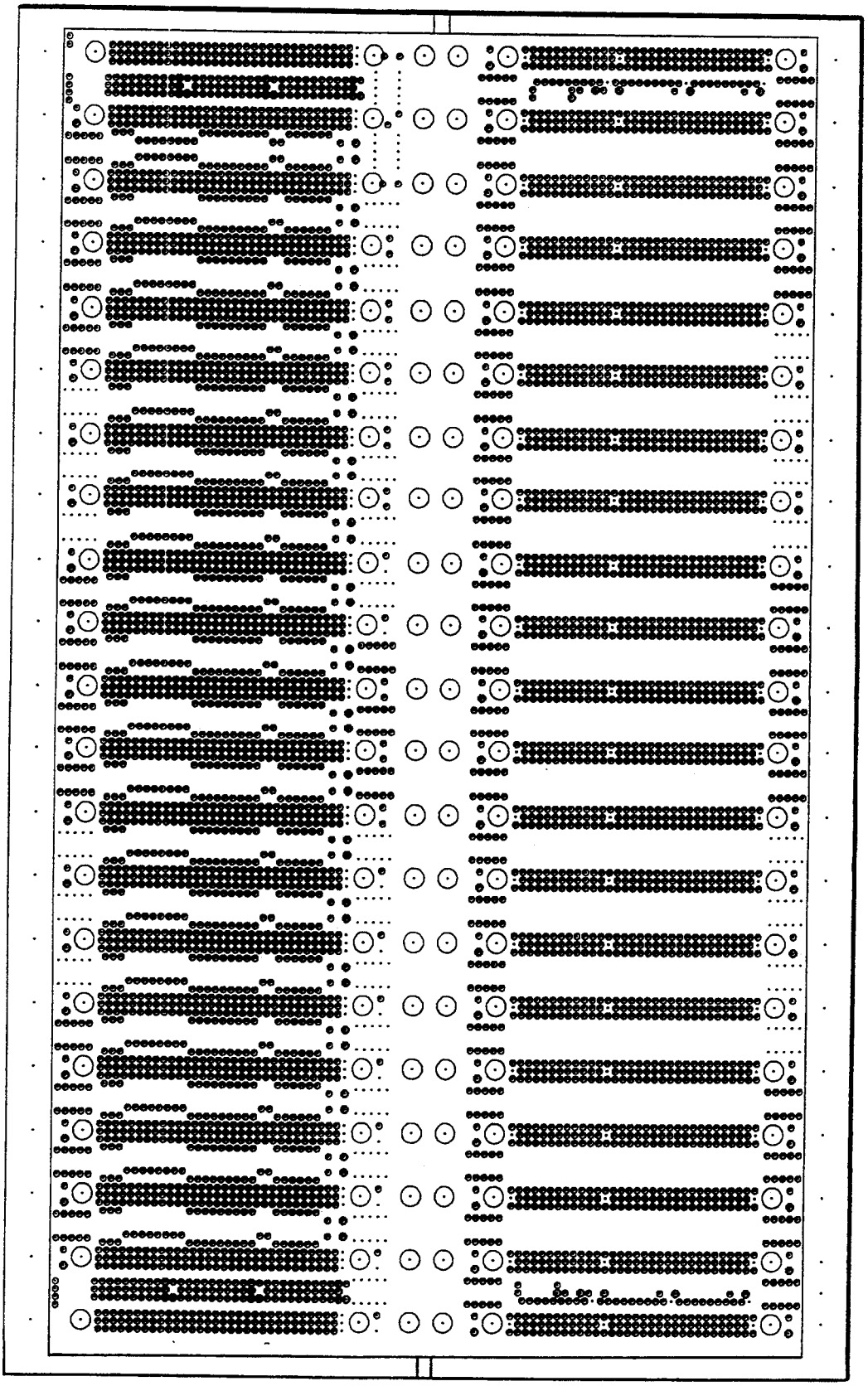
Figure 8:
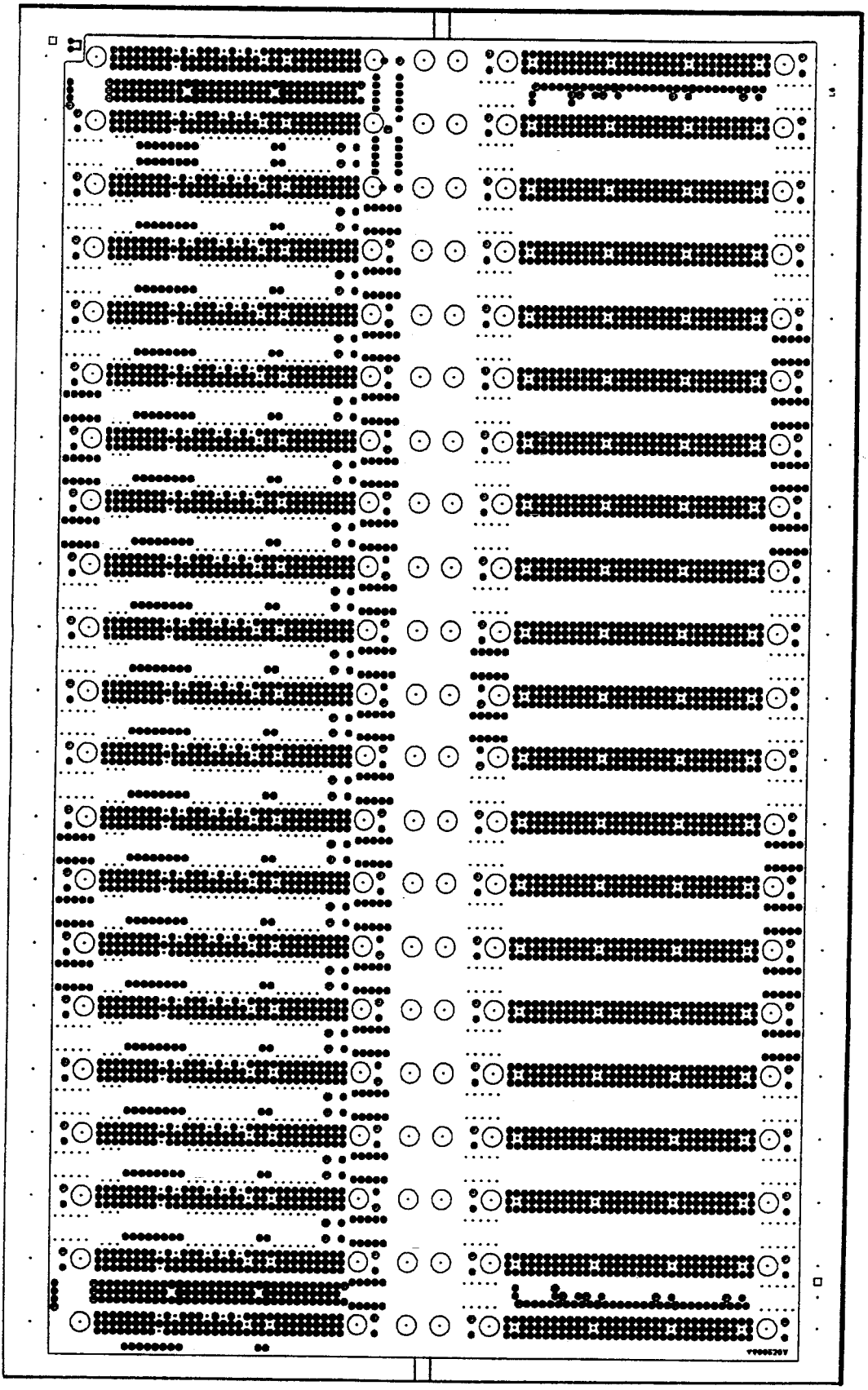
Figure 9:
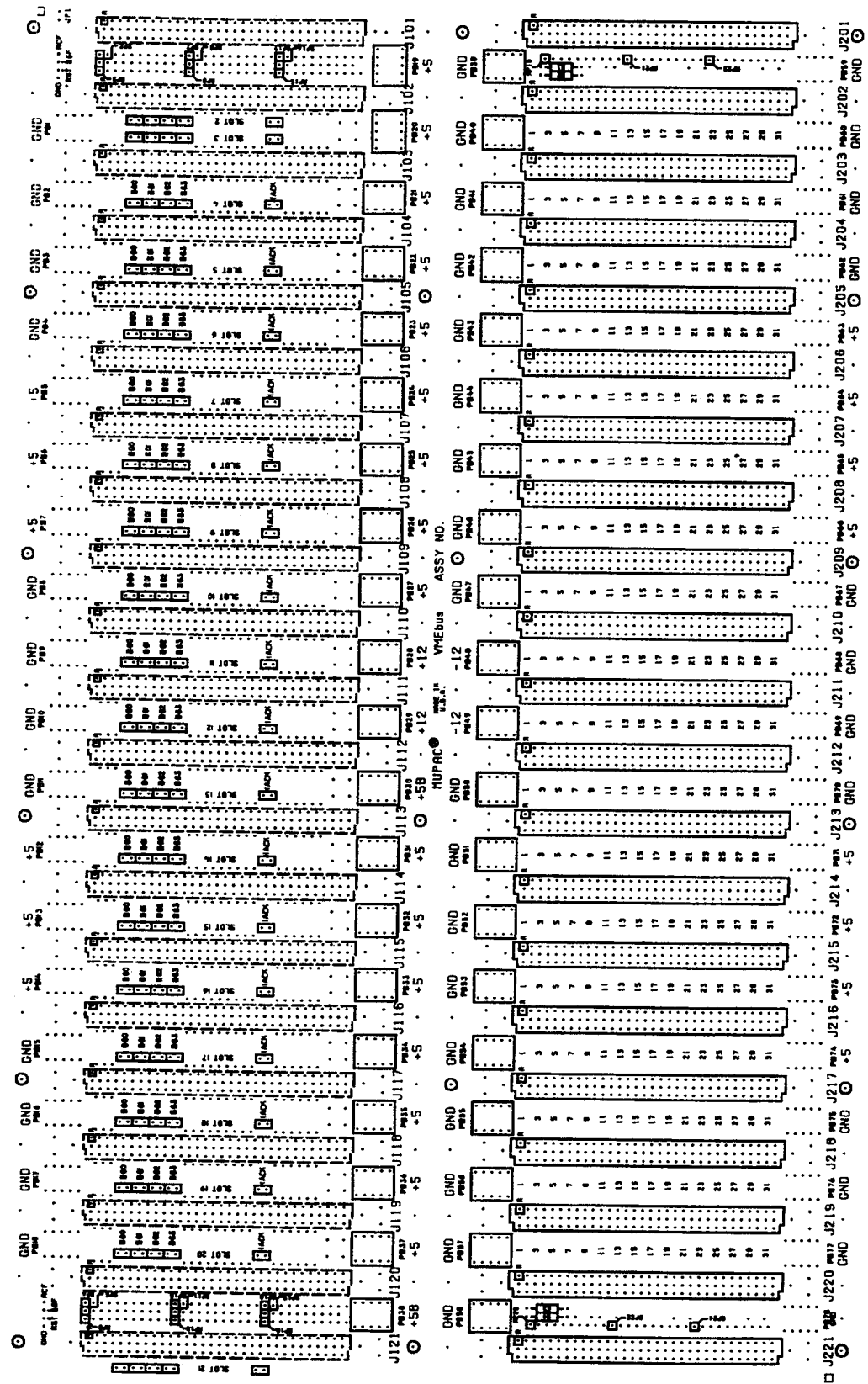
Figure 10:
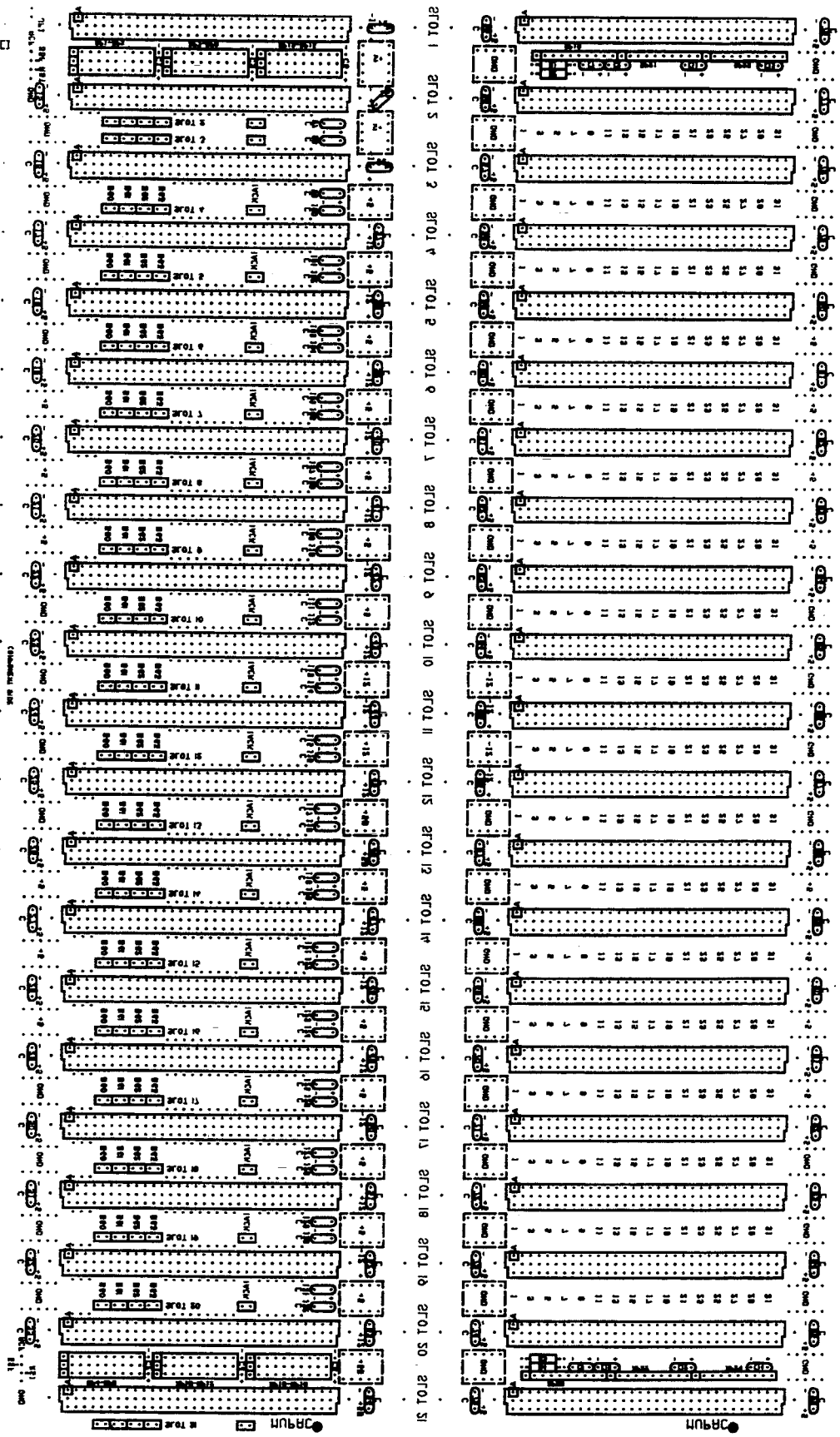

Referring to FIG. 1, a backplane 10 includes ten circuit layers 12 interleaved with nine glass epoxy insulating layers 14. The circuit layers of FIG. 1 and their functions correspond (based on the reference numerals in the Fig.) to the artwork of other Figs. as follows:

| Reference Numeral | Function | Figure |
| --- | --- | --- |
| 16 | ground | FIG. 2 |
| 18 | ground | FIG. 3 |
| 20 | signals, +12 V | FIG. 4 |
| 22 | ground | FIG. 3 |
| 24 | signals, −12 V, ground | FIG. 5 |
| 26 | ground | FIG. 3 |
| 28 | signals, +5 B (+5 V battery backup) | FIG. 6 |
| 30 | ground | FIG. 3 |
| 32 | $v_{cc}$, +5 V | FIG. 7 |
| 34 | ground | FIG. 8 |
| 36 | silk screening | FIG. 9 |
| 38 | silk screening | FIG. 10 |

The approximate thicknesses of the glass epoxy layers are as follows:

| Reference Numeral | Thickness |
| --- | --- |
| 15 | 0.006 |
| 17 | 0.006 |
| 19 | 0.018 |
| 21 | 0.018 |
| 23 | 0.018 |
| 25 | 0.018 |
| 27 | 0.018 |
| 29 | 0.006 |

Figure 11:
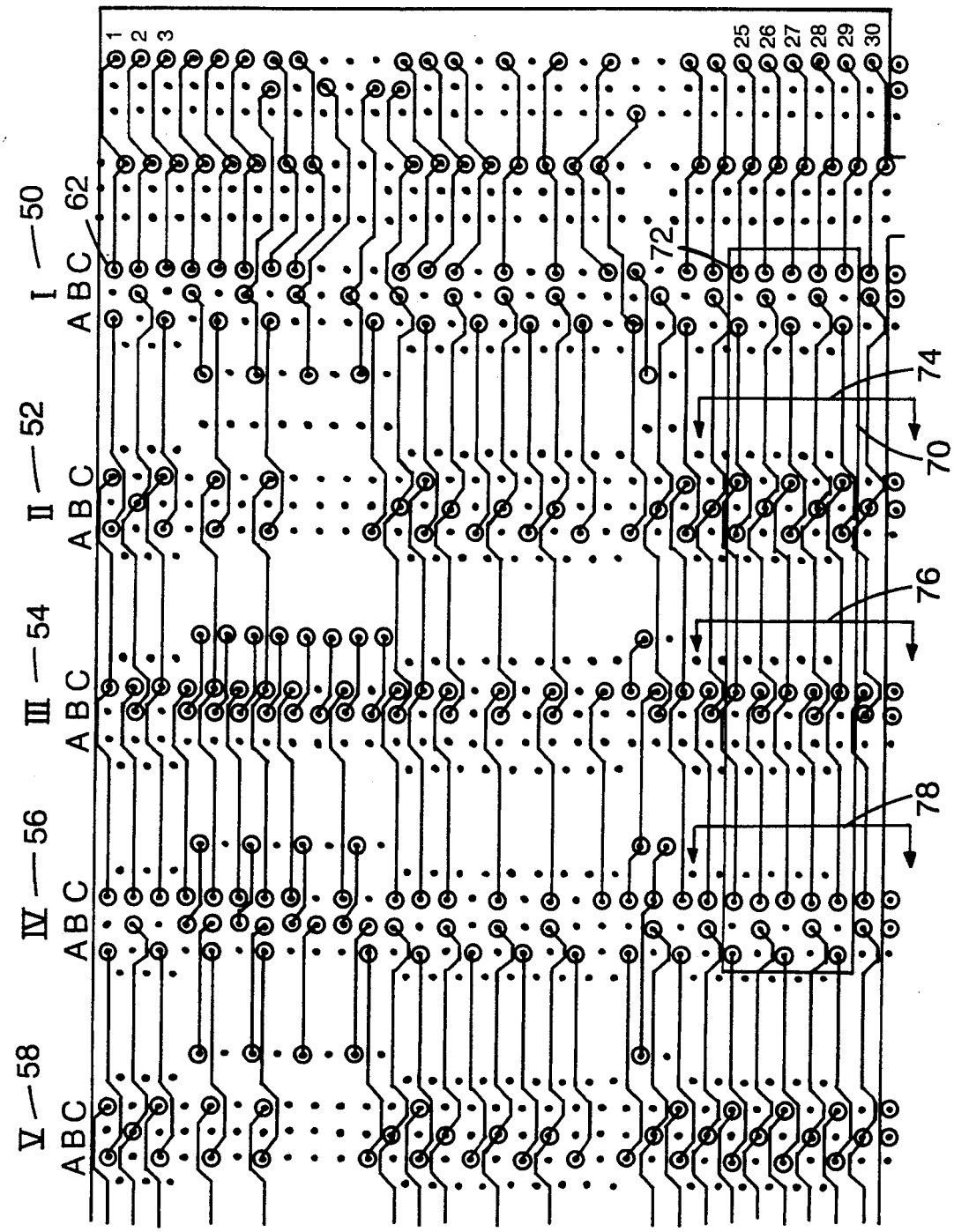
FIGS. 11 through 13 are enlarged views of portions of FIGS. 4, 5, and 6.
Figure 12:
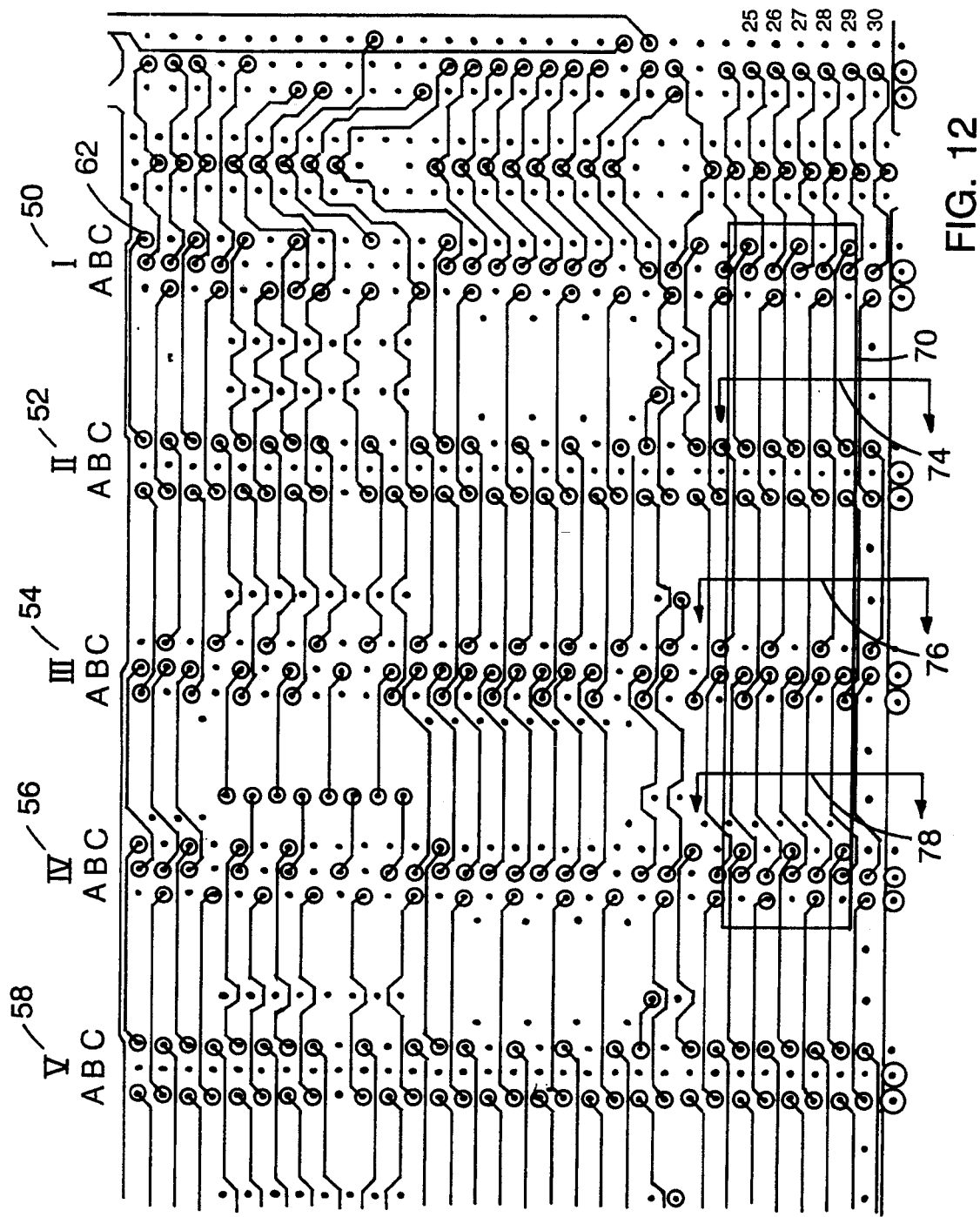
Figure 13:
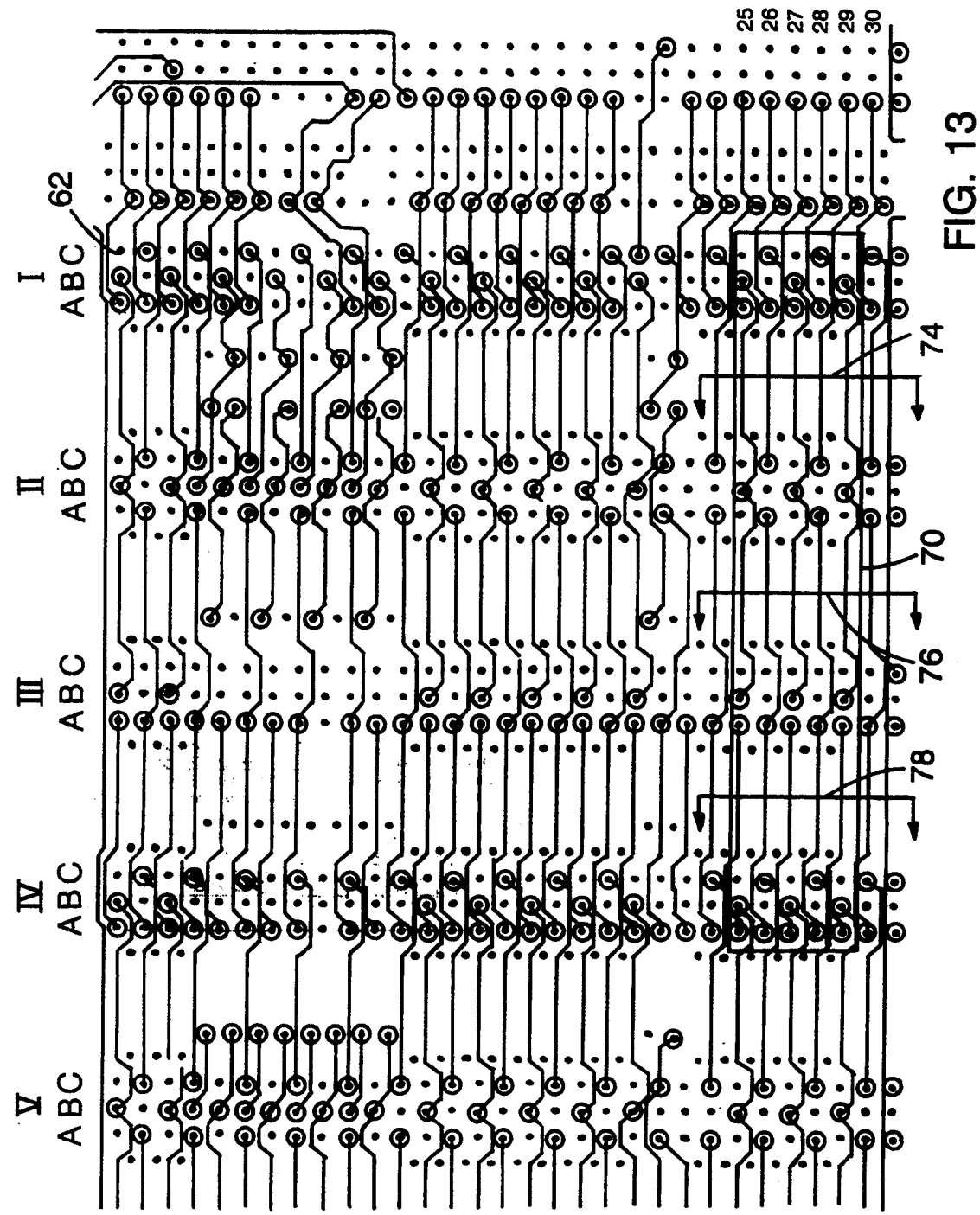

We now focus the discussion on the signal layers 20, 24, and 28, in particular the portions of those layers shown enlarged in FIGS. 11, 12, and 13, respectively.

Along the length of the board are a series of regularly spaced connector positions 50, 52, 54, 56, 58. At each position each layer has a grid of holes 62. (Note that on FIG. 13, for example, hole 62 is shown only as a point. This reflects the fact that FIG. 13 is the artwork used to mask the layer, not the appearance of the layer in the finished backplane. After masking and assembly of the layers of the board, holes are drilled through at all positions of the grid in a conventional way.)

The grid includes 3 columns of 32 holes each. The size (diameter 0.040 inches) and spacing (row spacing, 0.10 inches; hole spacing along a row, 0.10 inches) of holes in the grid conform to the size and spacing of the pins of a conventional connector (not shown) (e.g., a standard 96-pin DIN style connector, (type 41612) which is mounted on the finished backplane. Daughter boards may then be mounted on the backplane by inserting them into the connectors.

Each hole in each grid is designated with a column letter and a row number. With respect to at least some of the rows, corresponding holes of all of the connector positions are interconnected so that the same signal is carried to the corresponding holes at all positions. For example, all of the holes designated B28 would be connected together. (Because of other considerations, this arrangement is not true of some of the rows and hole positions shown on the Figs.)

In the invention, instead of simply connecting all of the B28 holes using traces (path segments) lying all on the same layer, the interconnections are provided by traces some of which are on one layer, some on another layer, with the traces interconnected by plated through holes between layers. In this way, the distance along which any two signal paths lie next to each other on the same layer is reduced, which in turn reduces electrical interference between different signals. (The traces are copper, approximately 0.0014 inches thick, and each about 0.010 inches wide.)

This principle is illustrated in FIGS. 11 through 13 by reference to a small section 70 of the signal layers. The pattern established there repeats at other connector positions and in some of the other rows of the board.

To simplify the discussion, we number the connector positions with Roman numerals from right to left. We refer to a hole by its connector position, column, and row, e.g., hole 72 is I-C25.

Thus, on layer 20 (illustrated in FIG. 11, I-A25 is connected to II-A25; IV-A25 is connected to V-A25; and so on. On the other hand, the connections of II-A25 to III-A25, and so on, occur on a different layer, layer 24 (illustrated in FIG. 12); and the connections of III-A25 to IV-A25, and son on, occur at a different layer, layer 28 (illustrated in FIG. 13). Plated through holes at II-A26, III-A25, and IV-A25 provide the connection between the traces on layers 20, 24, and 28.

In a similar way, holes I-B25, II-B25, and III-B25 are all connected by traces on layer 28, while the interconnection of III-B25 to IV-B25 occurs on layer 24, and so on.

Hole I-C25 is connected to hole II-C25 on layer 24, but the interconnection of holes II-C25, III-C25, and IV-C25 is on the layer 20.

These patterns for row 25 are all repeated in rows 27 and 29.

Similar principles apply to rows 26 and 28.

Figure 14:
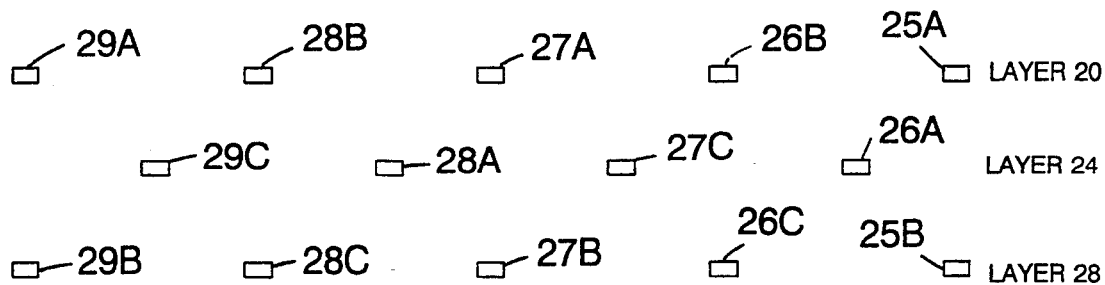
FIGS. 14 through 16 are schematic cross sectional views at three view points along the length of the backplane.
Figure 15:
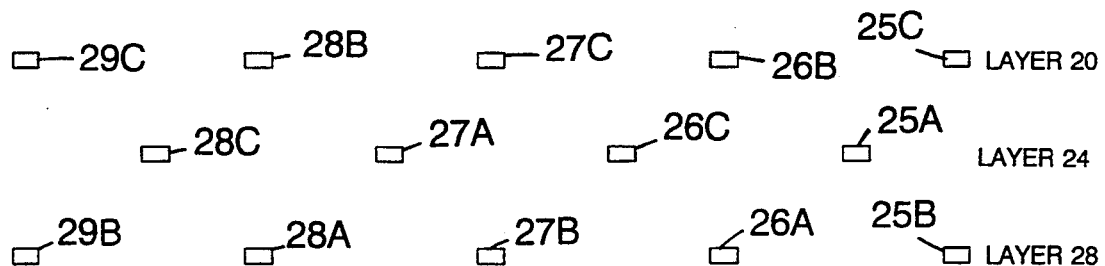
Figure 16:
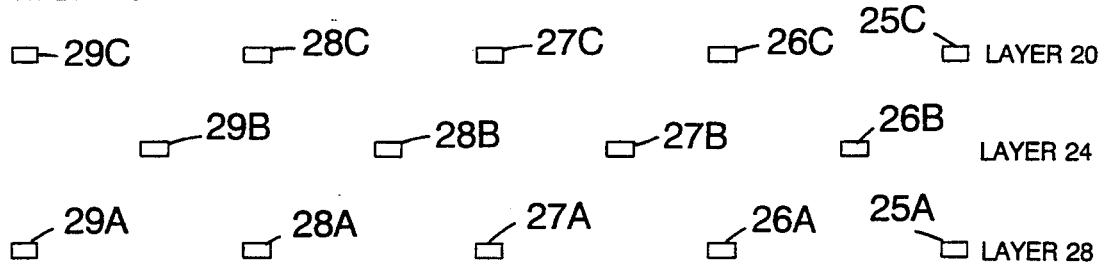
Figure 17:
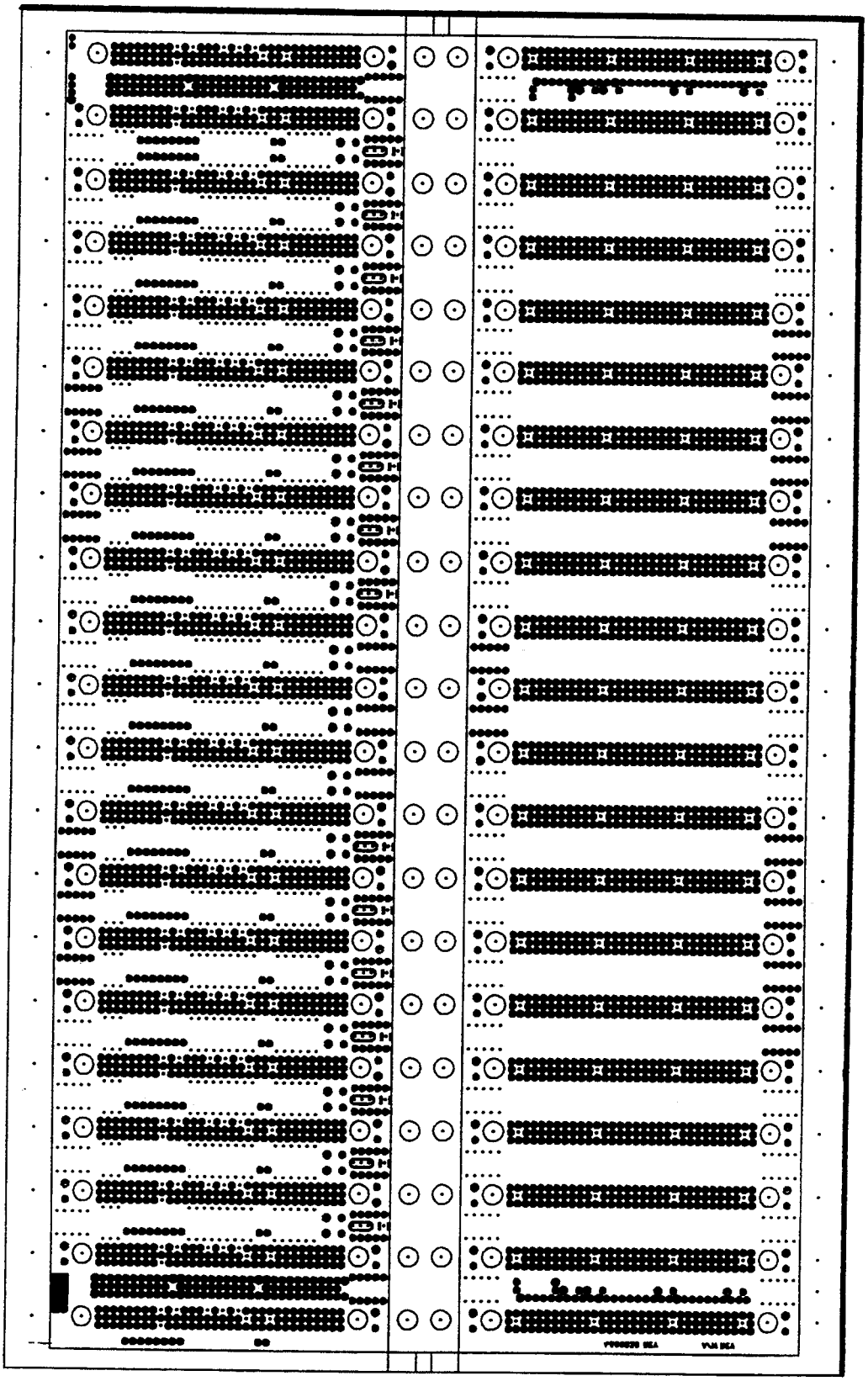
FIGS. 17 through 25 are plan views of fabrication artwork of another backplane.
Figure 18:
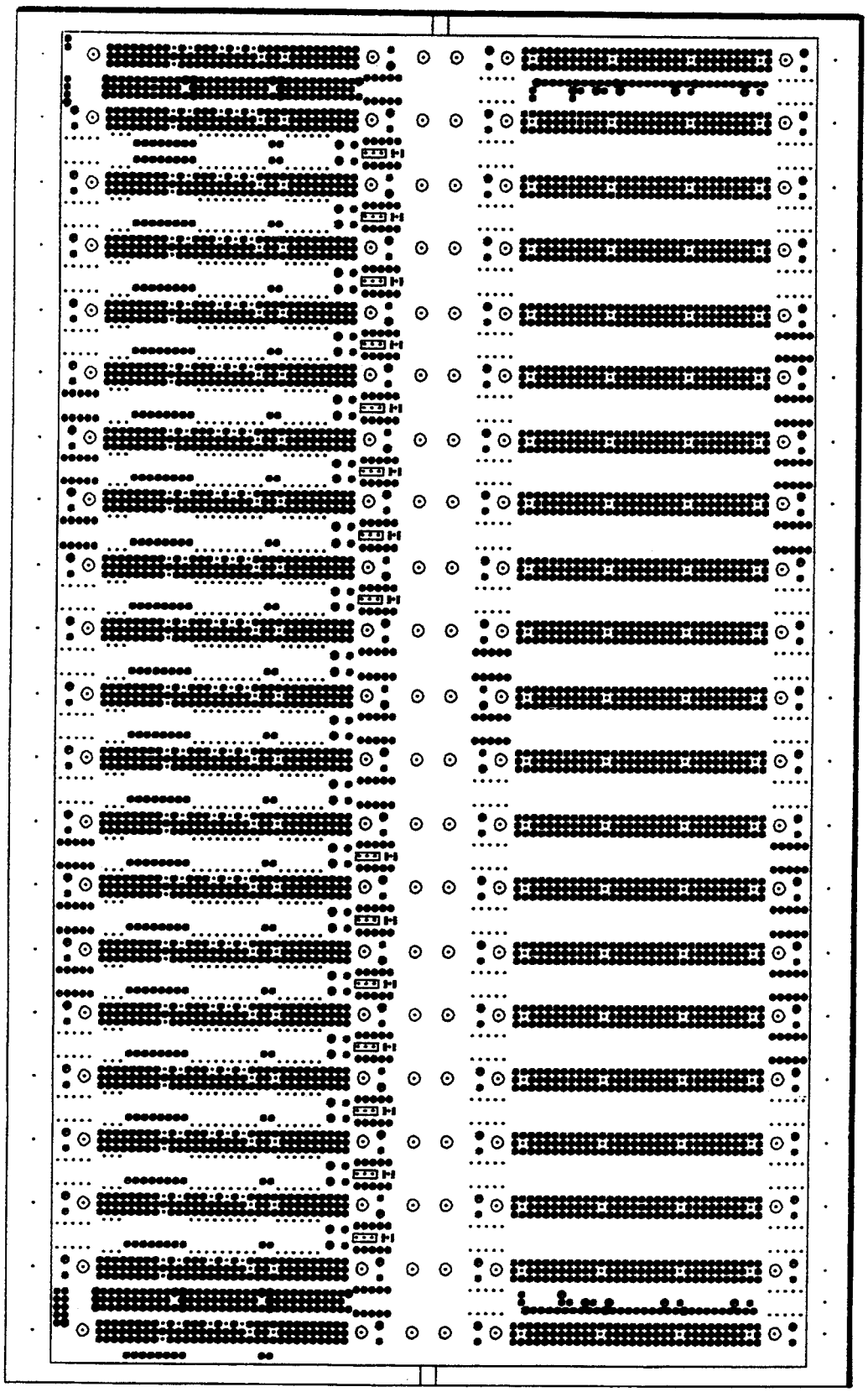
Figure 19:
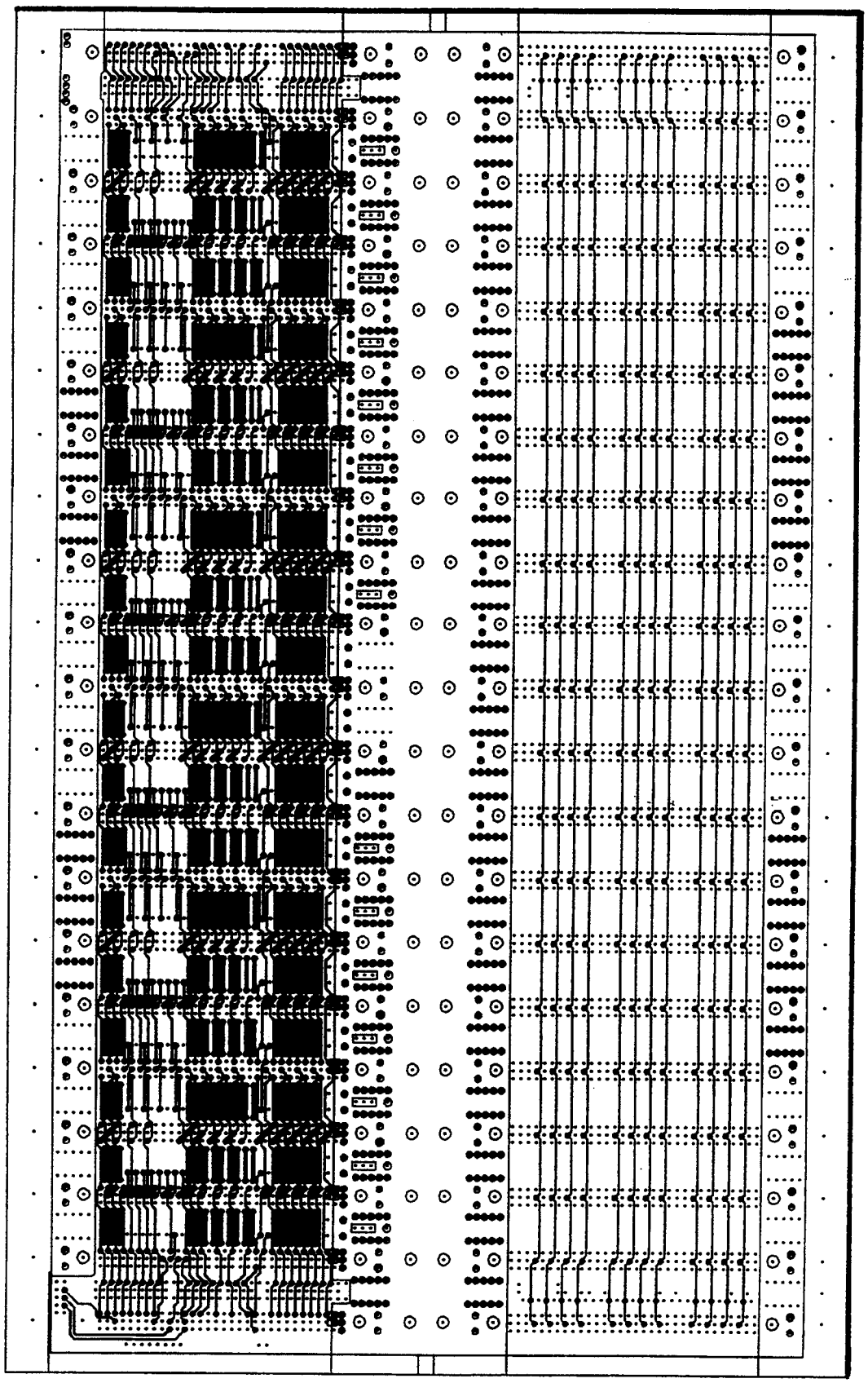
Figure 20:
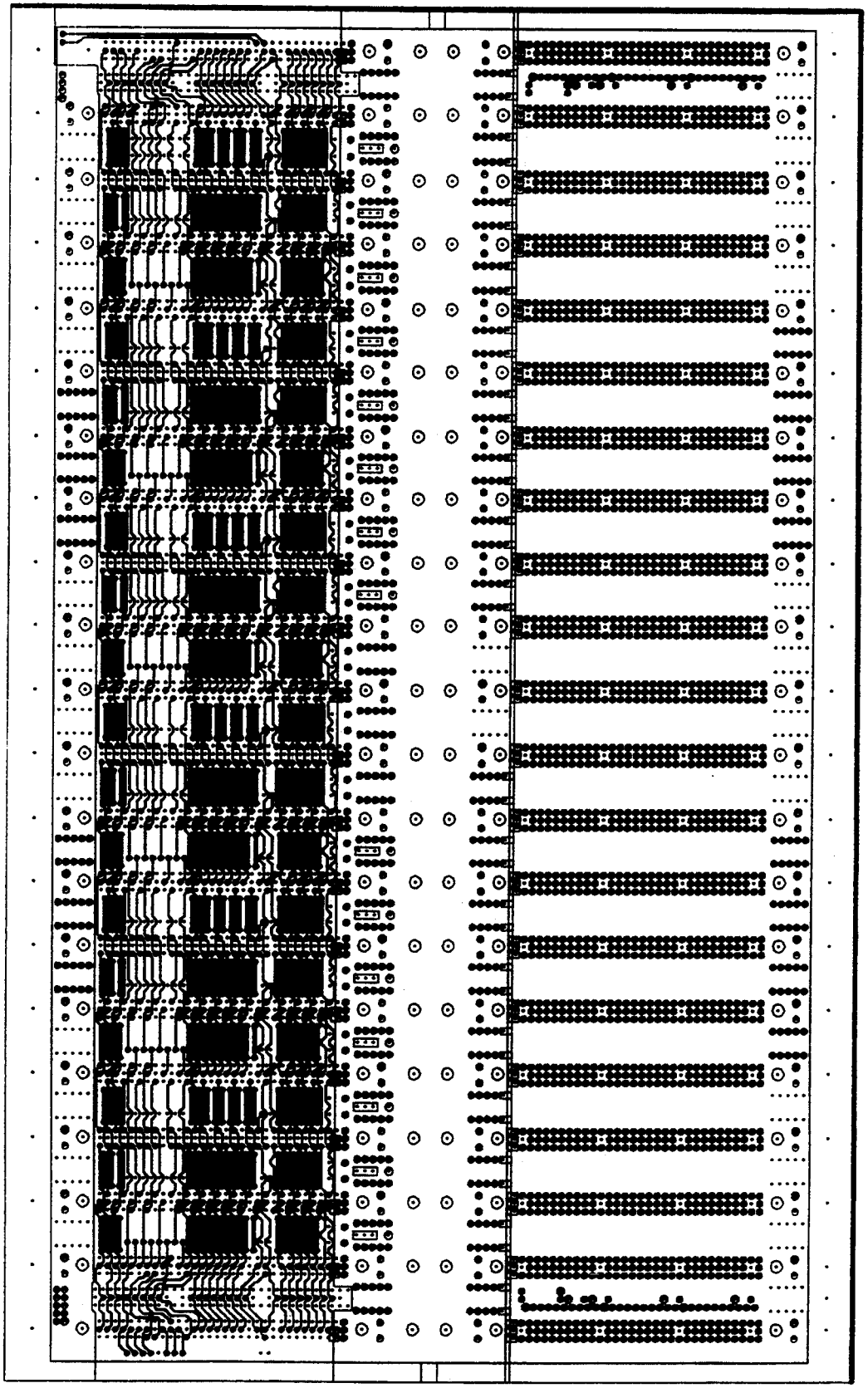
Figure 21:
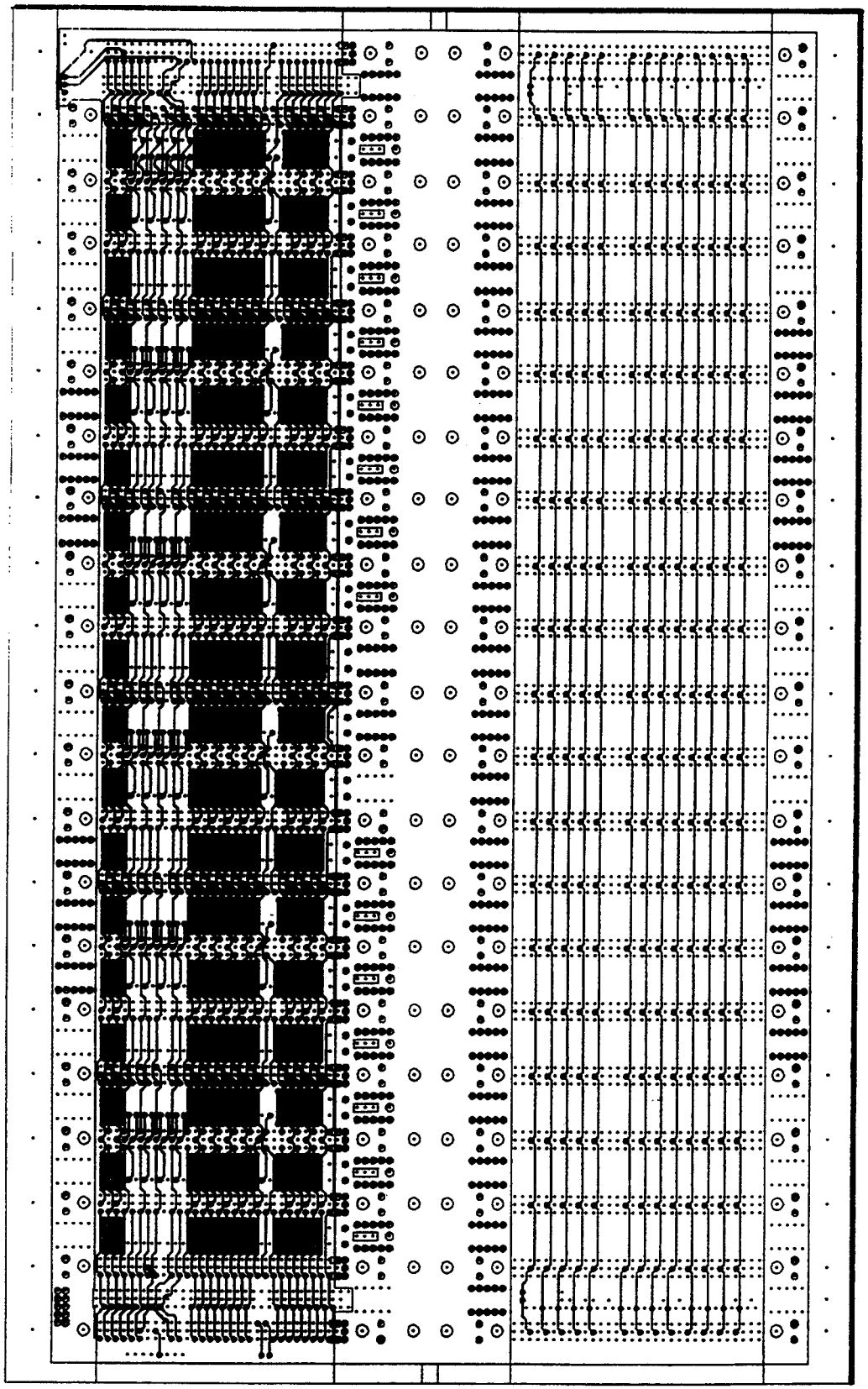
Figure 22:
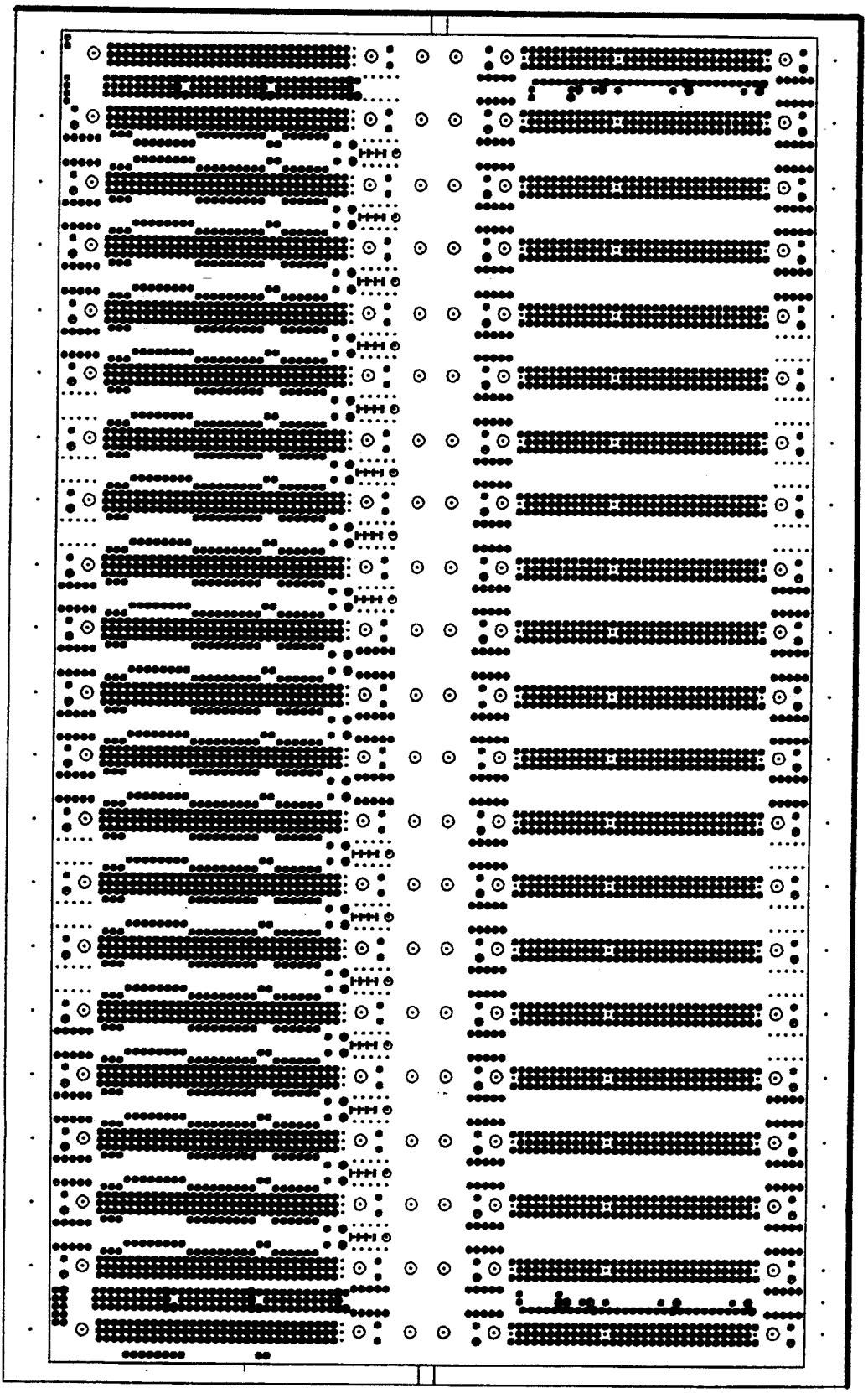
Figure 23:
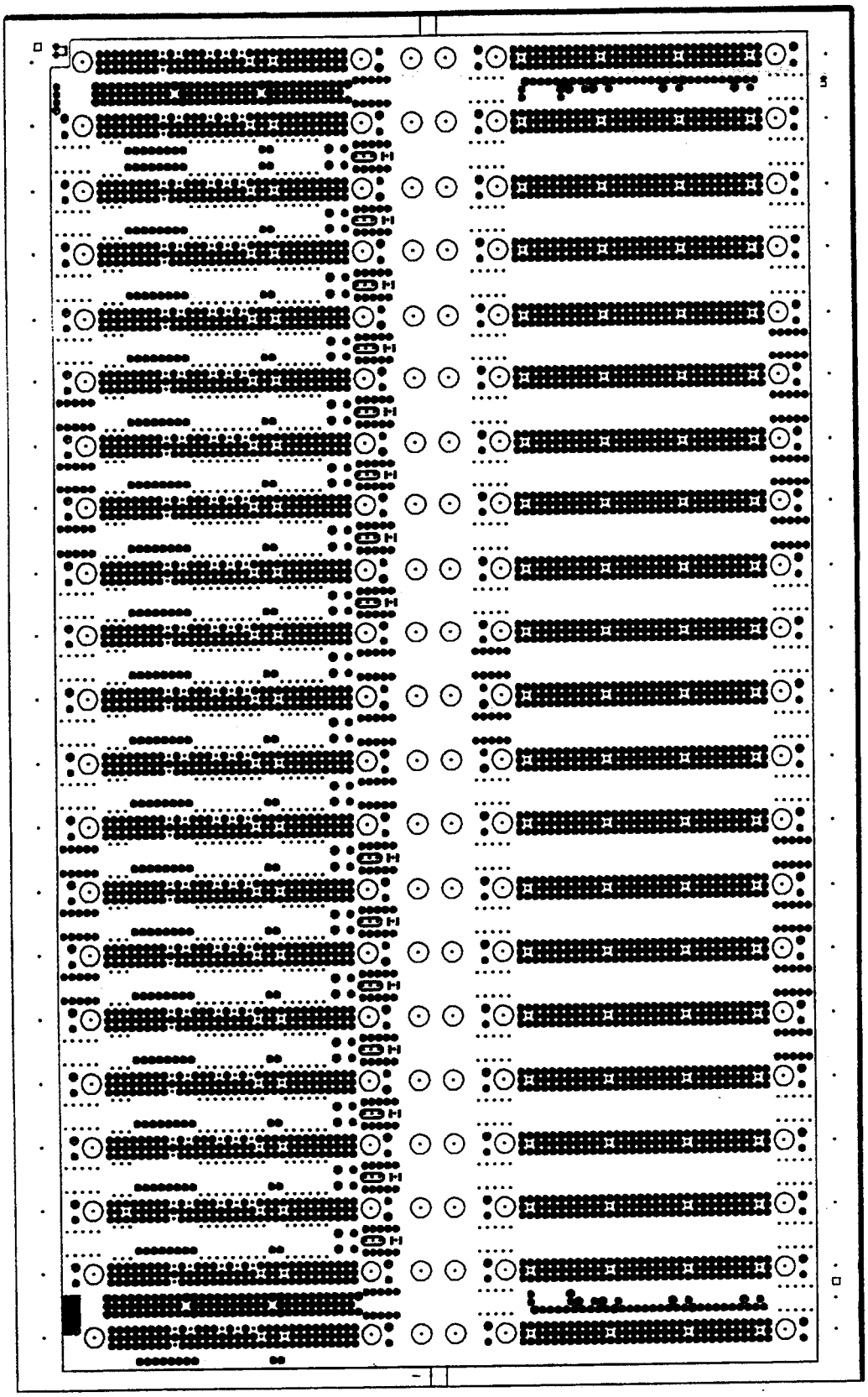
Figure 24:
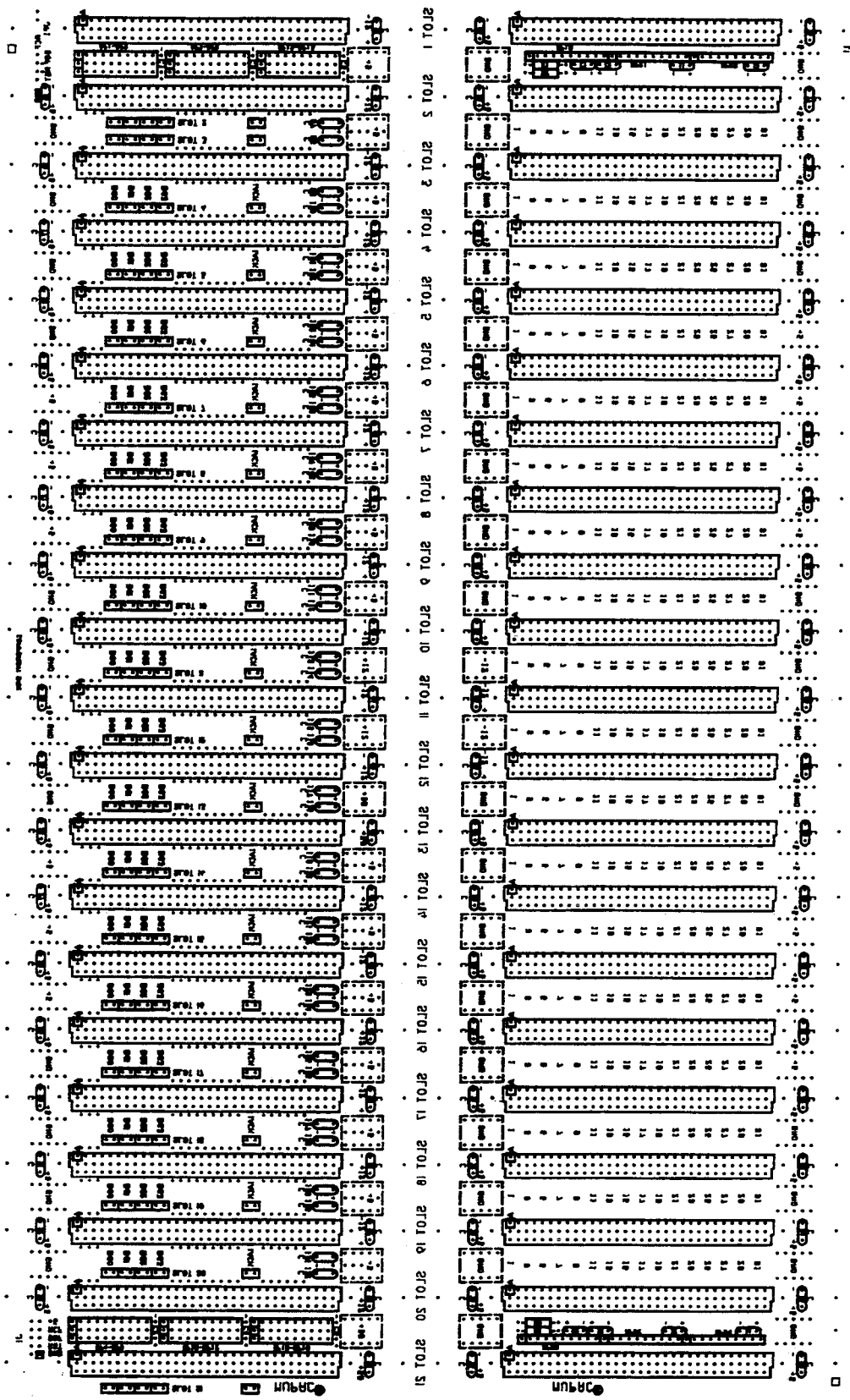
Figure 25:
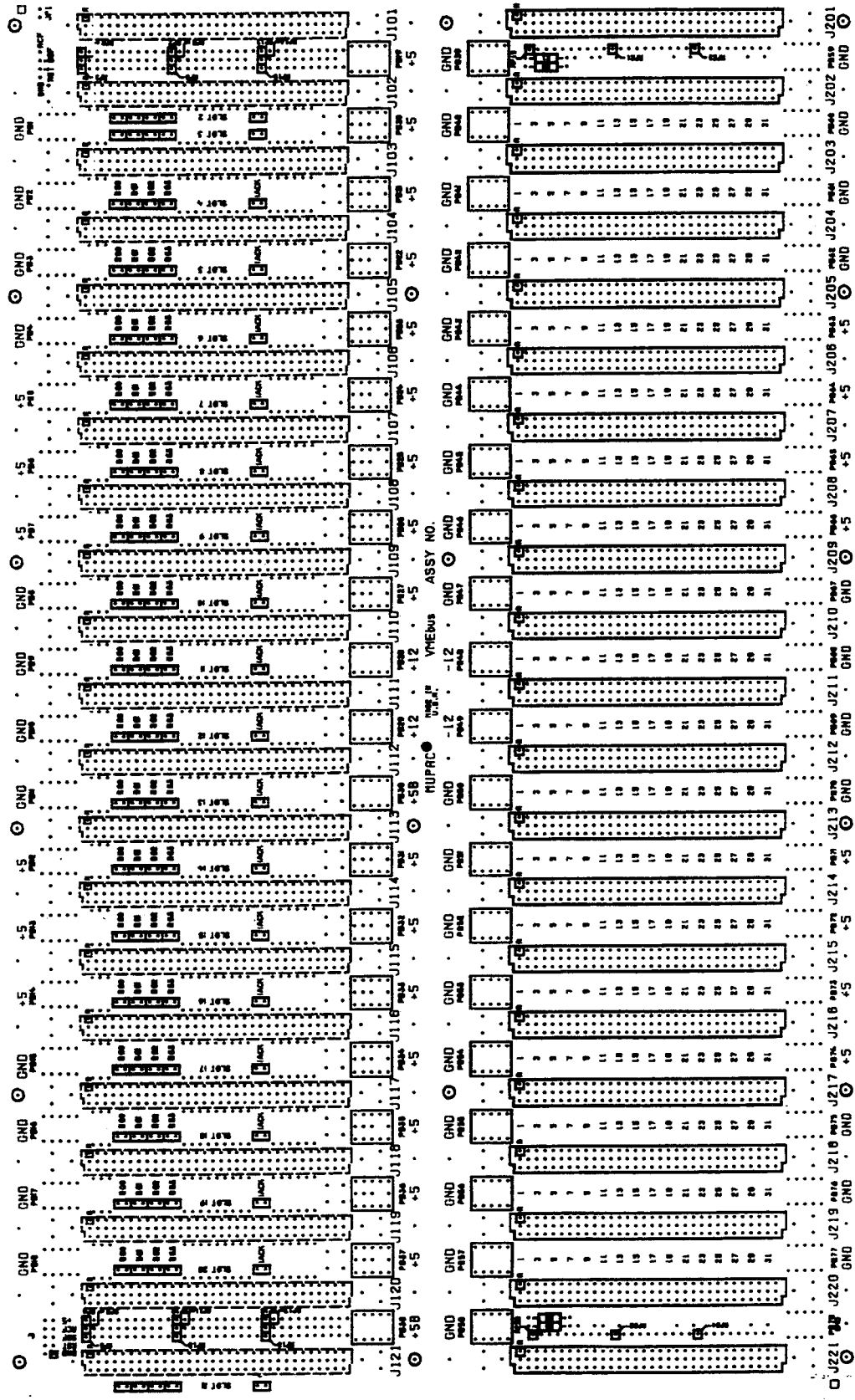
Figure 26:
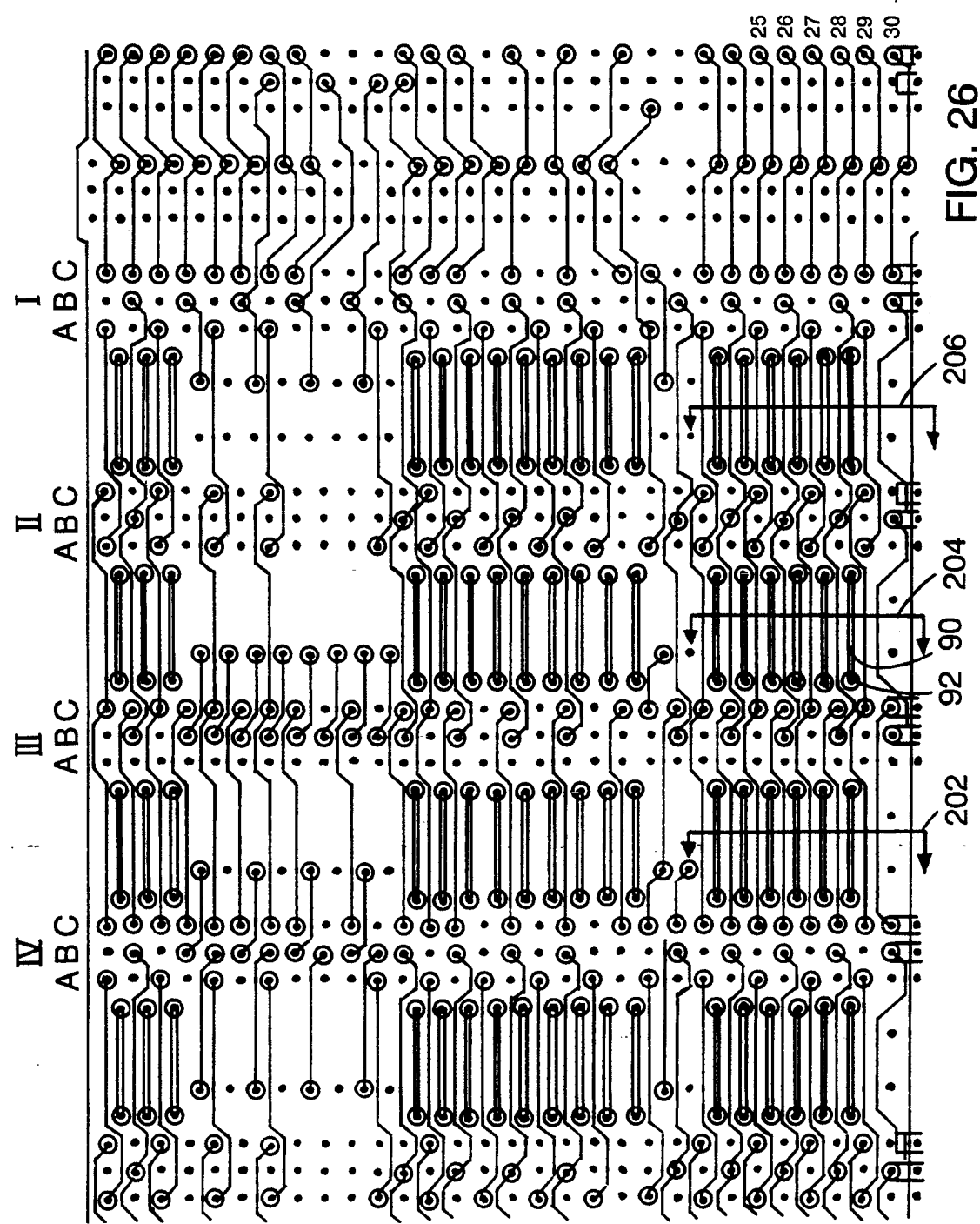
FIGS. 26 through 28 are enlarged views of portions of FIGS. 19, 20, and 21.
Figure 27:
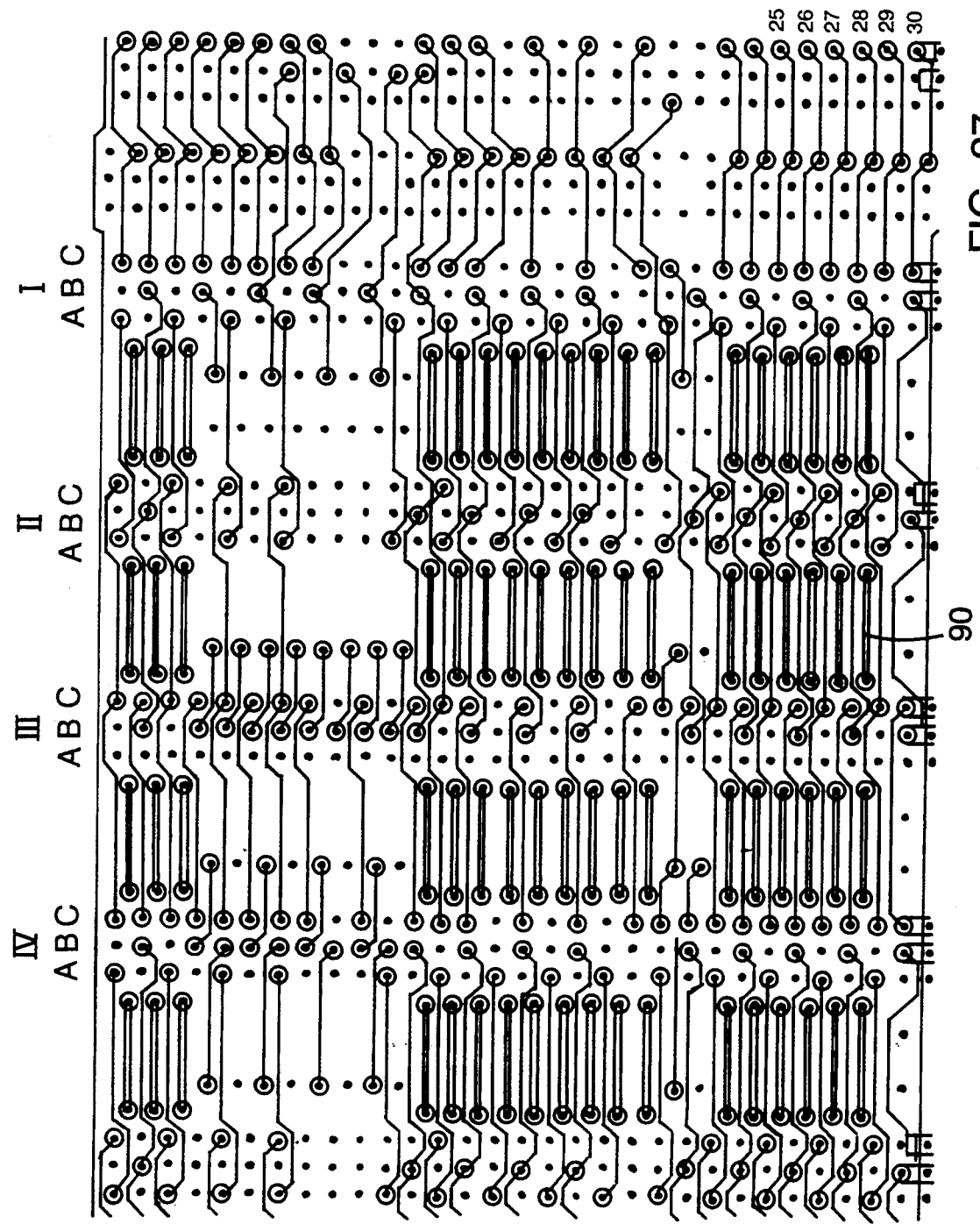
Figure 28:
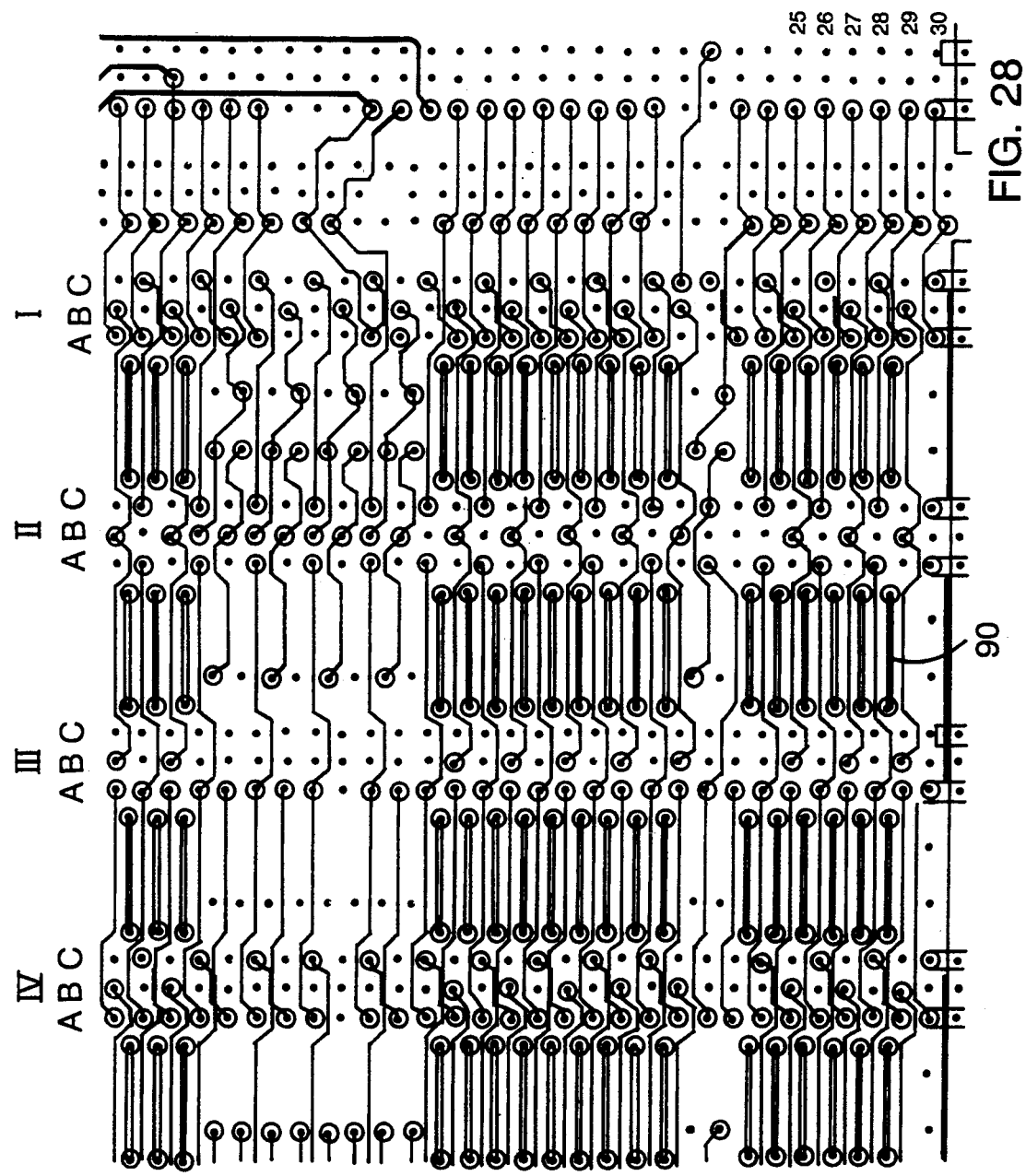

The advantage of this arrangement is apparent in FIGS. 14, 15, 16. Note, for example, that in layer 20, signal path 28B runs adjacent to 27A only in the path segment represented at cross-section line 74 (FIG. 14), while only in FIG. 15 is 28B adjacent 27C, and only in FIG. 16 is it adjacent 27B. Furthermore, the signal paths on layer 24 are not immediately beneath the signal paths of layer 20, but rather are offset midway between the signal paths of layer 20. This enhances the distance between a signal path on one layer (e.g., 29C on layer 20) and the nearest signal paths on the other layer (e.g., 29A and 28B on layer 20) by an amount which can be determined by simple geometry. This increased distance also reduces electrical interference.

In another embodiment, in which the ten layers are shown in FIGS. 17 through 23, the traces on one layer are not offset from the traces on the other layer. Instead grounded guard traces 90 are interposed between adjacent signal traces. In the artwork of the Figs. each guard trace is shown as a double line, but in the finished backplane layer the guard trace includes the double lines and all of the space between them as shown in one example of guard trace 90. Each guard trace is electrically connected to one or more of the ground layers by plated through holes 92.

Other embodiments are within the following claims.

A variety of other patterns could be used for the jumping back and forth between layers of the conductive routes. And by providing additional plated through holes in the board at locations between the connector positions, the layer switching may occur more frequently along the board.

The scheme is not limited to the interconnection of connectors on a backplane but can be used in any application which requires routing or bussing of terminal areas arranged in rows and/or columns.

What is claimed is:

1. An electrical interconnection board comprising:
   connection regions spaced along one dimension of the board, each connection region including a pattern of holes for making electrical connections,
   overlying layers each having a pattern of conductive path segments which lie between the connection regions and which connect holes at each connection region with corresponding holes at other adjacent connection regions, the path segments together defining continuous conductive routes along the board,
   each conductive route comprising path segments which lie on different ones of the layers.

2. The board of claim 1 wherein said conductive path segments lie generally parallel to each other and, some of the path segments on one of said layers have a non-overlying relationship with some of the path segments on a different one of said layers.

3. The electrical interconnection board of claim 1 or 2 further comprising
   ground planes, and
   conductive guard traces on said layers connected to said ground planes and electrically insulated from said holes at said connection regions.

4. The electrical interconnection board of claim 2 wherein said path segments of one of said layers lie midway between path segments disposed on a different one of the layers.

5. The electrical interconnection board of claim 1 wherein there are N said layers and said pattern of said conductive path segments repeats every N said connection regions along said board.

6. The electrical interconnection board of claim 5 wherein N is 3.

7. The electrical interconnection board of claim 1 wherein all of the path segments of each said conductive route lie on only two of said layers.

8. A backplane comprising
   96-pin DIN connectors spaced regularly along the length of the backplane,
   three signal path layers,
   at each connector a matrix of 3 columns of 32 rows each of plated through holes through said signal path layers,
   conductive path segments connecting holes at each connector with corresponding holes at other connectors, the path segments together defining continuous conductive routes along the length of the backplane, each conductive route jumping back and forth between different ones of said signal path layers.

9. A multilayer printed circuit board, comprising:
a dielectric layer;
dielectrically separated electrical conductors disposed on the dielectric layer and passing in a generally common, predetermined direction, each of the electrical conductors comprising:
first electrically conductive, dielectrically separated segments disposed on one side of the dielectric layer;
second electrically conductive, dielectrically separated segments disposed on a different side of the dielectric layers; and
electrical interconnects disposed between the sides of the layer to interconnect the first and second segments.

10. The multilevel printed circuit board recited in claim 9 wherein some of the first electrically conductive segments of one of said electrical conductors are disposed in a non-overlying relationship with some of said second electrically conductive segments of said one of the electrical conductors.

11. A multilayer printed circuit board, comprising:
dielectrically separated electrical conductors passing along the board in a predetermined direction, each one of the electrical conductors comprising:
first electrically conductive, dielectrically separated segments disposed on one level of the board;
second electrically conductive, dielectrically separated segments disposed on a different level of the board; and
electrical interconnects disposed in registration with ends of the first and second segments to serially interconnect an end of a first one of the segments with an end of a second one of the segments.

12. The multilayer printed circuit board recited in claim 11 wherein the first segments of one of the conductors are laterally offset from the second segments of such one of the plurality of conductors.

* * * * *

UNITED STATES PATENT AND TRADEMARK OFFICE
CERTIFICATE OF CORRECTION

PATENT NO.   : 5,397,861

DATED        : March 14, 1995

INVENTOR(S)  : David H. Urquhart, II

It is certified that error appears in the above-identified patent and that said Letters Patent is hereby corrected as shown below:

On the Title page, Item [56], References Cited, U.S. PATENT DOCUMENTS, please insert the following:

5,245,136    9/1993    Chance et al. ....... 174/262

Signed and Sealed this

Fourteenth Day of May, 1996

Attest:

BRUCE LEHMAN

Attesting Officer

Commissioner of Patents and Trademarks